United States Patent [19]

Boysel

[11] Patent Number: 5,618,759
[45] Date of Patent: Apr. 8, 1997

[54] METHODS OF AND APPARATUS FOR IMMOBILIZING SEMICONDUCTOR WAFERS DURING SAWING THEREOF

[75] Inventor: Robert M. Boysel, Plano, Tex.

[73] Assignee: Texas Instruments Incorporated, Dallas, Tex.

[21] Appl. No.: 454,766

[22] Filed: May 31, 1995

[51] Int. Cl.⁶ .................................. H01L 21/302
[52] U.S. Cl. ............................... 438/464; 83/84
[58] Field of Search .................. 437/226; 83/84; 125/13.01

[56]  References Cited

U.S. PATENT DOCUMENTS 4,261,781  4/1981  Edmonds ..................... 437/226
5,489,555  2/1996  Yamazaki ..................... 437/226
5,543,365  8/1996  Wills et al. .................... 437/226

*Primary Examiner*—R. Bruce Breneman
*Assistant Examiner*—Vanessa Acusta
*Attorney, Agent, or Firm*—Robert C. Klinger; James C. Kesterson; Richard L. Donaldson

[57]  ABSTRACT

A method of immobilizing both (i) a semiconductor wafer (16) during the sawing thereof to form individual chips (18) and (ii) the resulting chips (18) as and after sawing of the wafer (16) is completed. A negative pressure is applied to the wafer (16) through a wafer carrier (12) to immobilize the wafer and individual chips. The negative pressure is applied to the wafer via ports (30) in alignment with the location of each chip (18) to be formed. A grid (40) or negative pressure is used to restrain the chips as they are subsequently transported following sawing.

29 Claims, 3 Drawing Sheets

METHODS OF AND APPARATUS FOR IMMOBILIZING SEMICONDUCTOR WAFERS DURING SAWING THEREOF

BACKGROUND OF THE INVENTION

CROSS REFERENCE TO RELATED APPLICATIONS

Cross Reference is made to commonly assigned copending patent application Ser. No. 08/038,779 filed Mar. 29, 1993 entitled "Grid Array Masking Tape Process" the teachings of which is incorporated herein by reference.

1. Field of the Invention

The present invention relates to methods of and apparatus for immobilizing semiconductor wafers during the sawing thereof, and, more particularly, to methods of and apparatus for immobilizing (a) semiconductor wafers during the sawing thereof and (b) chips resulting from such sawing, which method and apparatus eliminate the need for a support tape and permit the wafers, qua wafers, to be sawed into chips, cleaned, undercut by plasma etching and probed, without the use of tape.

2. Prior Art

Numerous processes are known for producing plural arrays of active sites in and on a first surface of a semiconductor wafer. Each active site may comprise one or more transistors and may include an integrated circuit having other circuit components. The wafer is ultimately separated into a plurality of individual chips, also known as dies or bars, each of which includes one of the active site arrays, the array having a "top" surface comprising a portion of what was formerly the wafer's first surface.

The separation of the wafer into individual chips is effected by an operation which may be referred to as "sawing." Sawing separates the wafer along saw lines or saw paths, which may be referred to as "streets," extending between locations whereat adjacent active site arrays reside or will ultimately reside. The streets may be defined before sawing by scribing the wafer with an appropriate instrument.

Sawing, which often involves mechanical cutting, abrasion and/or erosion of the wafer, has been achieved by a number of techniques, including those which utilize rotating saw blades and vibrating tips. Properly sawing a wafer requires that the streets be accurately delineated and followed by the sawing instrumentality. This accuracy, in turn, requires that the wafer be accurately held or immobilized during sawing so that the wafer and the saw are and remain accurately positionally related during sawing.

The act of sawing the wafer produces substantial debris which includes small pieces of the wafer and possibly small pieces of the saw blade or vibrating tip. Sawing is also typically effected with the use of cooling/lubricating fluids and other substances which prevent the saw blade or tip from damaging the wafer and which prolong the life of the saw blade or tip. Fluids used in sawing wafers may significantly contribute to damage to the active sites, and, in some cases, may actually carry debris to active-site-harmful locations to which the debris might not otherwise migrate.

The debris resulting from and the substances used in sawing can degrade the performance of or render inoperative the active sites. As a consequence, wafers may be sawed into chips before carrying out the processing which produces the active sites. After sawing, the resulting chips may be maintained in a matrix. The matrix of chips is processed to produce the active site arrays on each one thereof. Often the chips are maintained in the matrix by tape-like materials adhered to the chips for that purpose.

Where active sites are first produced on wafers which are thereafter sawed into chips, tape similar to that described immediately above may be used to maintain the active-site-containing chips in a matrix thereof corresponding or congruent to the original array of active sites formed on and in the wafer. However, it may be undesirable to leave the tape in place during certain operations such as post-site-formation plasma etching procedures following cleaning of the chips to remove sawing debris. These operations may be inhibited or prevented by the presence of the tape. For example, plasma etching may cause the tape to exude gases or other substances which interfere therewith or which damage the active sites.

Nonetheless, it is desirable for the original array of active sites to be maintained and preserved in the matrix of chips during cleaning, plasma etching and probing/testing. The unsuitability of tape during some operations has led to small quantities of chips being manipulated during post-sawing operations rather than these operations being performed on the entire site array or chip matrix.

If the active sites include a micromechanical device, including a spatial light modulator ("SLM"), such as that known as a deflectable mirror device or a digital micromirror device (collectively "DMD"), each active site may be even more sensitive to the effects of the debris and fluids resulting from and used in sawing. Moreover, it is advantageous if simultaneous plasma etching of each DMD on a wafer is effected.

A DMD is a multilayered structure formed on a wafer, which includes a light-reflective mirror. The mirror is associated with an active site and is supported by a beam (cantilever, torsion, flexure, etc.) so as to be deflectable or movable between a normal position and other positions. Deflection of the mirror may be achieved by electrostatically attracting it toward (or to) a spaced electrode which is at a different electrical potential from that of the mirror. Deflection of the mirror stores energy in its supporting beam, which stored energy tends to return the mirror to its normal position. Movement of the mirror, which may be binary or analog, is controlled by the associated circuit components of the active site functioning as an addressing circuit. Deflection of the mirror is facilitated by an undercut well which underlies the beam and into which the mirror moves when it is deflected. The well may be formed by the above-noted plasma etching of one of the layers of material deposited on the wafer.

Because a DMD includes circuit components as well as a microminiature deflectable mirror, it is especially sensitive to debris resulting from sawing the wafer and to the fluids and other substances used to facilitate sawing. Specifically, such debris can enter the undercut, plasma-etched well and prevent deflection of the beam. Because the undercut well offers an attractive resting place for sawing debris, production of DMD's often starts with formation of the electrical components of the active sites, immediately followed by sawing of the wafer. Later the sawed wafer—now a matrix of chips—is cleaned and the undercut well is formed by plasma etching. This sequence prevents the sawing debris from entering the wells, the formation of which occurs only after sawing has occurred.

In use, an array or matrix of DMD's is arranged to receive light from a source. The received light which is incident on the mirrors is selectively reflected or not reflected onto a viewing surface depending on the position of the mirrors. Such reflected light is directed by each mirror onto the viewing surface in only one selected position, which may be the normal position or one of the other positions. In all other positions of each mirror other than the selected position, the incident, reflected light is directed in such a way that it does not fall on the viewing surface. Appropriate energization of the circuit components of the addressing circuit associated with each mirror permits the mirror-reflected light on the viewing surface to be presented as a rasterized array of pixels (as in a typical television) or as a scanning line of pixels (as in a line printer). Thus, the mirror of each active site is or acts as a pixel.

In some DMD production techniques, formation of the circuit components of the active sites and etching or other steps which define the mirrors are followed by the deposit or placement of a protective layer or cover thereon. Sawing of the wafer to separate the arrays then proceeds, the protective layer or cover preventing the sawing operation from damaging the circuit components and the etch-defined mirrors. After sawing is completed, the protective layer or cover is removed and the undercut wells are then formed under each mirror by plasma etching. Formation of the wells at this time obviates the sawing-related substances from entering the wells. In other techniques, protective layer or cover deposition or placement follows formation of the active sites, the mirrors and the wells.

As noted above, sawing of wafers before active site formation requires either that the resulting chips be accurately maintained in their original relative orientation during active site producing processing or that each chip be individually or small-batch processed to produce its array of active sites. These expedients are costly and their implementation is time-consuming.

One object of the present invention is the provision of a method of, and apparatus for, immobilizing both (a) semiconductor wafers during the sawing thereof and (b) chips resulting from such sawing, which method and apparatus eliminate the need for a support tape and permit previously partially processed wafers, qua wafers, to be sawed into chips, cleaned, plasma etched and probed, without the use of the tape.

SUMMARY OF THE INVENTION

With the above and other objects in view, the present invention contemplates a method of immobilizing both (i) a semiconductor wafer during the sawing thereof to form individual chips and (ii) the resulting chips as and after sawing of the wafer is completed. A first step of the method is placing the wafer on a carrier so that the wafer and the chips to be formed have a predetermined orientation relative to the carrier. This orientation may be achieved by engaging complementary surface features on the wafer and the carrier.

Next, a negative pressure is applied to the wafer through the carrier. This immobilizes the wafer and maintains the wafer-carrier orientation, as well as the orientation of the chips to be formed relative to the carrier. The negative pressure is applied to the wafer in alignment with the location of each chip to be formed.

The wafer is then sawed into chips while the negative pressure continues to be applied in alignment with, and immobilizes, each chip as it is formed by the sawing. This maintains the orientation of the chips relative to the carrier. Restraining forces are applied to the now formed chips to maintain chip-carrier orientation as the carrier and the chips thereon are transported following sawing.

In one embodiment of the method, the restraining force is applied by associating with the chips a grid which extends between adjacent chips along the sawing paths. The grid is selectively disassociable from the chips. In another embodiment of the method, the restraining force is applied by continuously applying a negative pressure to the chips following their formation. This continuous negative pressure may be achieved by applying a negative pressure to a chamber within the carrier and then sealing the chamber to retain the negative pressure during transportation of the carrier and the chips. The negative pressure is maintained by virtue of a seal provided by the smooth surfaces of chips and the carrier. If the seal is inadequate, and elastic gasket material could be used between the wafer and carrier to maintain a vacuum seal. The negative pressure may be applied to the wafer in a similar manner. In fact, the continuous negative pressure may be applied to both the wafer before sawing and to the chips after sawing by the continuous application thereof from a sealed chamber within the carrier.

The present invention also contemplates apparatus for effecting the method described above. The negative pressure is preferably applied to both the wafer and to the chips resulting therefrom via passages through the carrier and in alignment with the locations of the chips to be formed. Negative pressure may be applied to the wafer and to the chips from a vacuum chuck with which the carrier is temporarily associated during sawing. Negative pressure may be similarly applied at other processing stations. Negative pressure may also be continuously applied to the passages from a chamber within the carrier. Following evacuation, the chamber is sealed to maintain the negative pressure. In this way, the negative pressure may be applied continuously to the wafer and/or to the chips without the use of a vacuum chuck.

DETAILED DESCRIPTION

Figure 8:
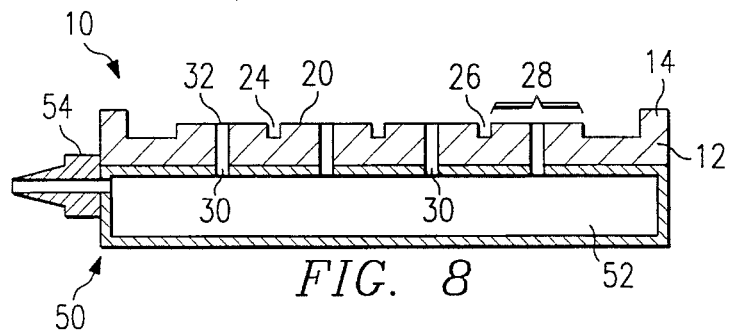
FIG. 8 is a sectioned side elevation of the carrier shown in FIG. 7.
Figure 9:
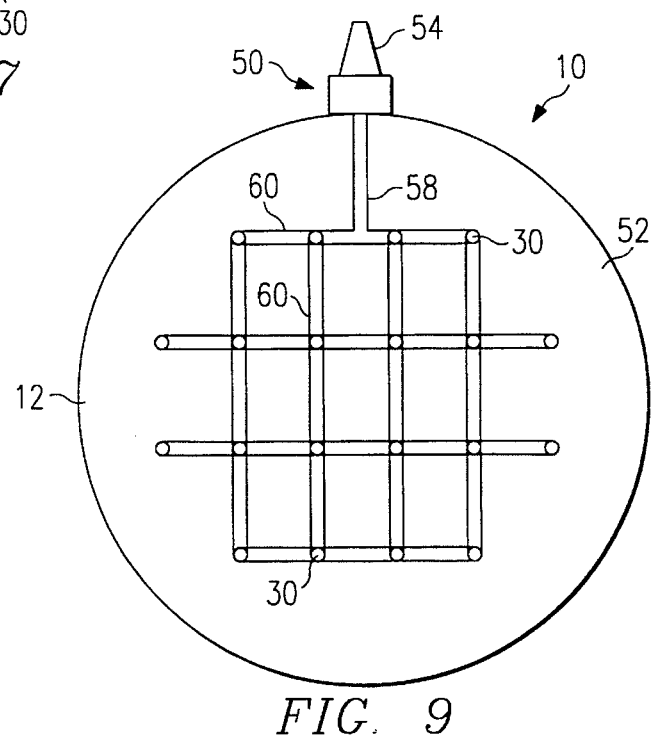
FIG. 9 is a bottom view of the carrier shown in FIG. 7 illustrating structure which is alternative to that depicted in FIG. 8.

Referring first to FIGS. 1–6, there is shown a carrier 10 which constitutes a portion of the apparatus of the present invention for carrying out the method thereof. An alternative embodiment of the carrier is shown in FIGS. 7–9.

The carrier 10 includes a base 12 surmounted by a peripheral lip 14. The base 12 and the lip 14 are preferably fabricated from a robust material, such as brass, steel, or aluminum, which will not react with or otherwise adversely affect a wafer 16 which is to be supported by the carrier 10 or chips 18 which result from sawing the wafer 16 and which are also supported by the carrier 10.

A top surface 20 of the base 12 and the surrounding lip 14 has formed therein saw guides 24. Where sawing is to be achieved by the use of a rotating blade 25 (FIG. 3), the saw guides 24 preferably take the form of a grid of grooves 26 formed in the surface 20. The width of grooves 26 is slightly oversized from that of the width of blade 25 so alignment is not so critical. Where the chips 18 are squares or rectangles, the grid is preferably orthogonal.

Figure 1:
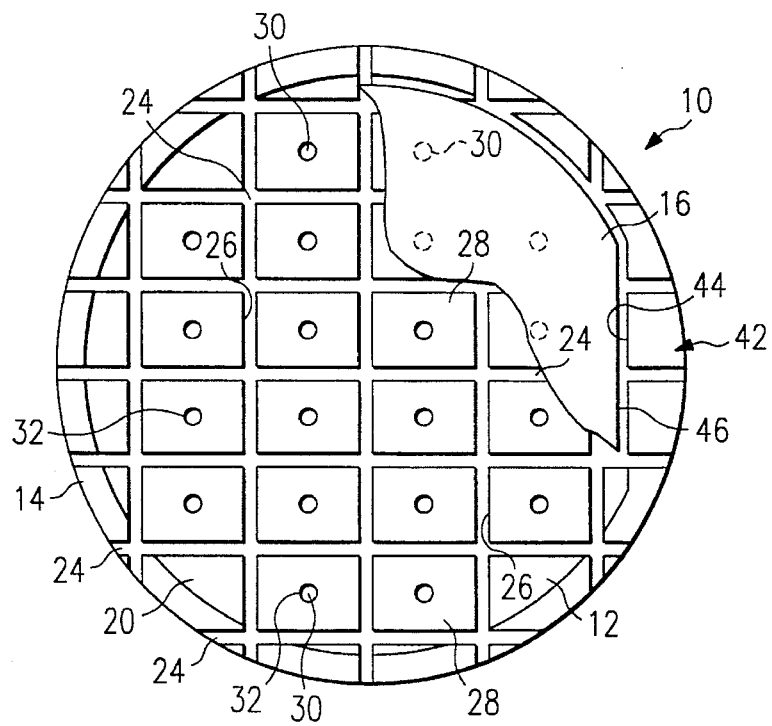
FIG. 1 is a generalized top view of a wafer and chip carrier according to the present invention for effecting the method thereof.
Figure 2:
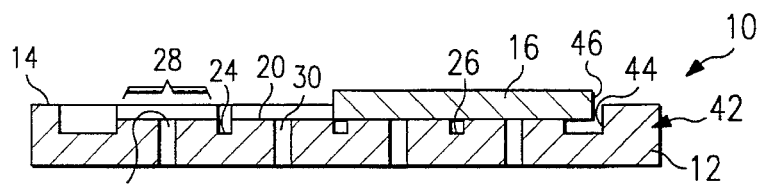
FIG. 2 is a generalized, side elevation, partially in section, of the carrier of FIG. 1.
Figure 3:
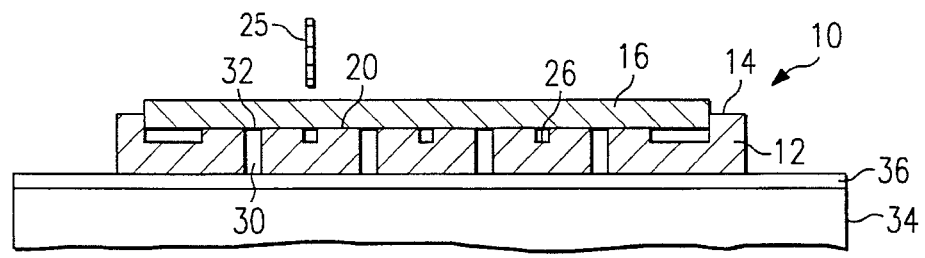
FIG. 3 is a view similar to FIG. 2 which shows a semiconductor wafer on the carrier and a vacuum chuck associated with the carrier.
Figure 4:
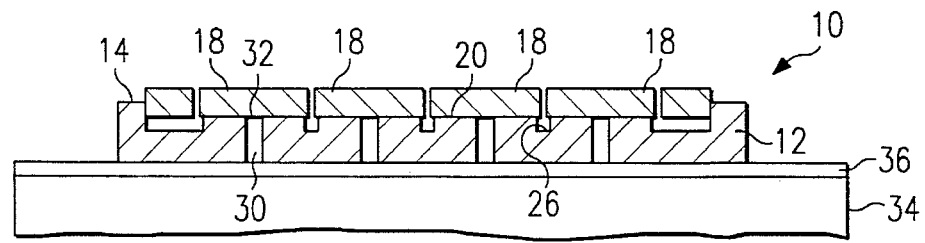
FIG. 4 is a view similar to FIG. 3 showing semiconductor chips on the carrier, the chips resulting from sawing of the wafer.

With a wafer 16 resting on the surface 20 of the base 12 and the rotating saw blade 25 being perpendicular to the wafer 16 (with the blades axis parallel to the wafer 16 as shown in FIG. 3), the blade and the wafer 16 are relatively moved to bring the blade into sawing contact with the wafer 16. As the wafer 16 is sawed, the blade extends downwardly, ultimately moving into the applicable groove 26 of the saw guide 22. The blade and the wafer 16 are then relatively moved to elongate the sawed region of the wafer 16 as the blade traverses and is guided by the groove 26. Relative movement of the blade and the wafer 16 may be achieved by movement of the carrier 10 and/or the facilities which mount the blade. The depth and width of the grooves 26 is, therefore, determined by the character of the saw blade 25 and its positional relationship to the base 12 during sawing.

The character and location of the saw guide 24 may be altered to accommodate sawing facilities other than a rotating blade.

The grid of grooves 26 comprising the saw guide 24 defines mesas 28. Each chip 18 resulting from sawing the wafer 16 rests on, and is generally congruent with, one of the mesas 28. Formed through the top of each mesa 28 and extending through the base 12 is a port or passageway 30 suitable for applying a negative pressure or suction to the terminus 32 of each port. Preferably, the port termini 32 are generally centrally located with respect to their mesas 28 and are circular as shown, but may have other shapes including radial slits or a star shape, for example. Negative pressure may be commonly applied to the ports 30 via a manifold (not shown) within the base 12. It is preferred to apply this negative pressure to the ports 30 with a vacuum chuck 34 when the carrier 10 rests thereon. The vacuum chuck 34 may apply negative pressure via a porous metal plate, generally depicted at 36, which supports the carrier 10. Such application of negative pressure may occur via the manifold (not shown) within the base 12 or to termini (not shown) of the ports 30 located on the bottom of the base 12. The negative pressure is maintained by virtue of a seal provided by the smooth surfaces of chips and the carrier. If the seal is inadequate, and elastic gasket material could be used between the wafer and carrier to maintain a vacuum seal.

In use, a wafer 16 is placed on the surface 20 and a negative pressure is then applied to the ports 30. This negative pressure immobilizes the wafer 16 due to its application to the underside thereof at each location (on top of the mesas 28) where a chip 18 will be formed by sawing the wafer 16. Sufficient negative pressure is applied while maintaining a good seal to immobilize the wafer 16 during the sawing thereof and to immobilize each chip 18 as it is formed by such sawing. After sawing, the carrier 10 may be transported to other locations for further processing of the chips 18. In the present embodiment, no negative pressure is applied to the ports 30 during transportation of the carrier 10.

Figure 5:
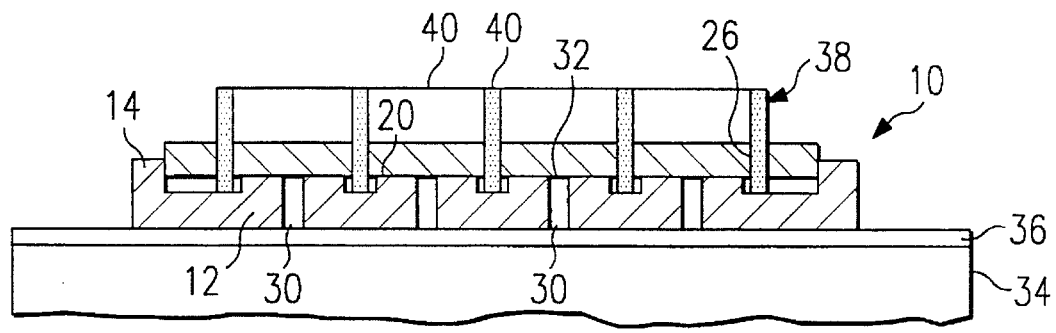
FIG. 5 is a view similar to FIG. 4 and taken along line 5—5 of FIG. 6 which shows a grid for restraining the chips as the carrier is transported.
Figure 6:
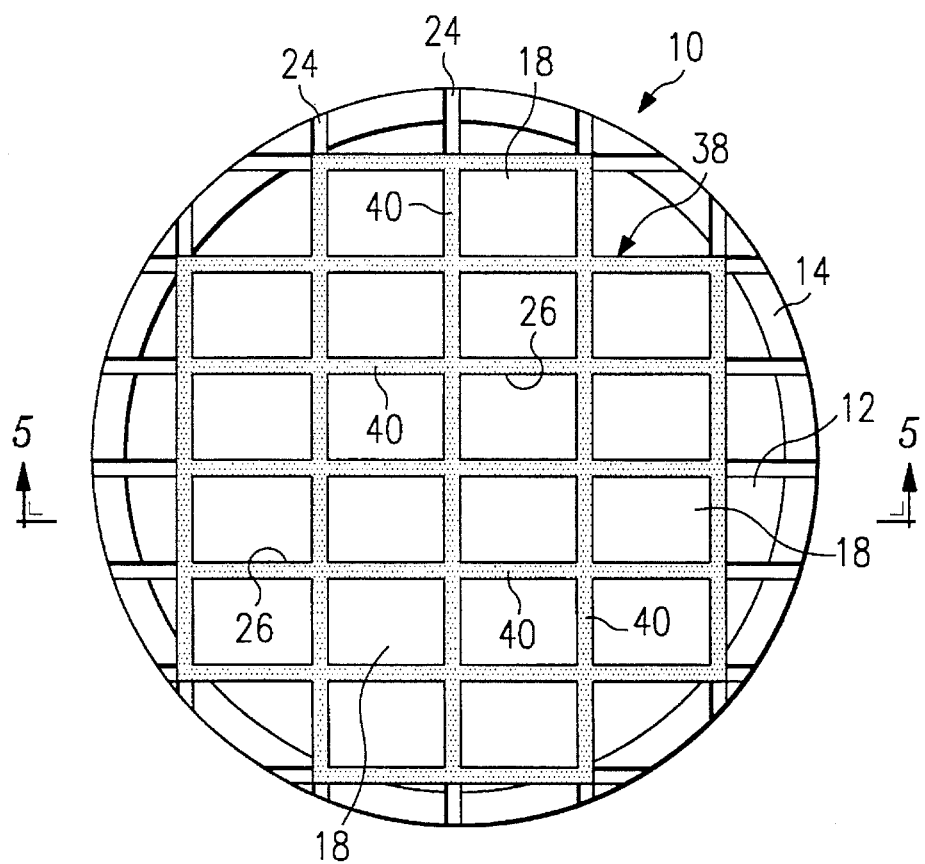
FIG. 6 is a generalized top view of the carrier, chips and grid shown in FIG. 5.
Figure 7:
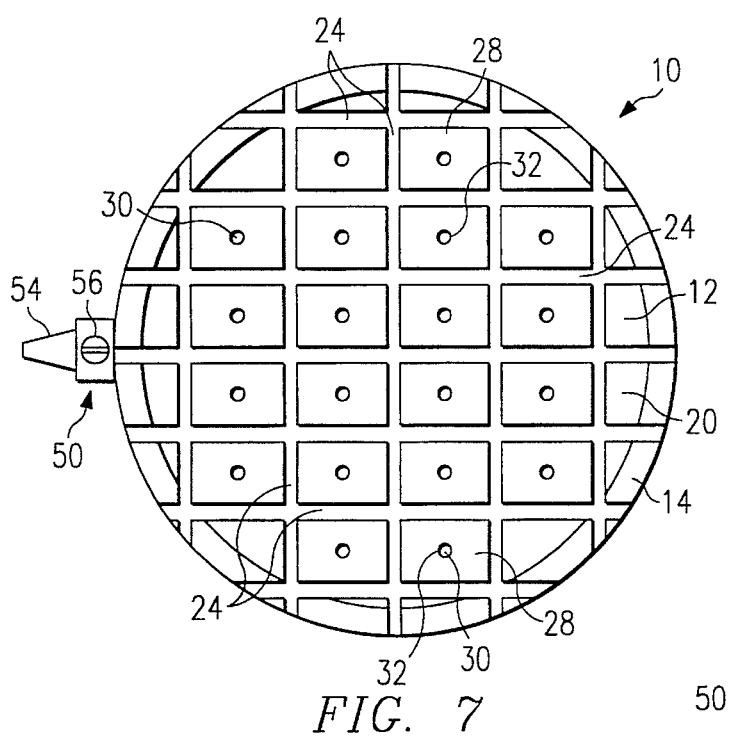
FIG. 7 is a generalized top view of an embodiment of the apparatus of the present invention for carrying out the method thereof, which embodiment includes a carrier which is an alternative to that depicted in FIGS. 1–6.

In view of the foregoing and in reference to FIG. 5 and FIG. 6, and in order to continue to restrain the chips 18 against movement so that they remain on their mesas 28, prior to transportation of the carrier 10, a grid 38 of connected elongate members 40 congruent with the grid of grooves 26 is located over the chips 18, preferably while the negative pressure continues to be applied thereto. The grid 38 is moved toward the chips 18 until portions of the members 40 move into the grooves 26 adjacent to the sides of the chips 18 supported on the mesas 28. The portions of the members 40 not in the grooves 26 extend sufficiently above the surface 20 and chips 18 to prevent the chips 18 from laterally moving as the negative pressure ceases to be applied to the ports 30 and the carrier 10 is thereafter transported. At subsequent processing locations, the grid 38 may remain in place if it does not interfere with chip processing. Contrariwise, the grid 38 may be removed following the application of negative pressure to the chips 18 via the ports 30 by a vacuum chuck 34 or similar device.

In some embodiments, the wafer 16 is substantially circular and its periphery is congruent with the inside surface of the lip 14. The wafer 16 and the lip 14 may have other congruent configurations. The congruent relationship of the wafer 16 and the lip 14 establishes a predetermined lateral orientation of the wafer 16 relative to the carrier 10 following placement of the wafer 16 on the surface 20. If a selected relative rotational orientation of the wafer 16 relative to the carrier 10 is desired, the wall of the lip 14 may include a surface feature 42, such as a projecting flat abutment 44, which mates with and engages a matching chordate edge or "flat" 46 on the periphery of the wafer 16. Whatever is the selected relative orientation of the wafer 16 relative to the carrier 10, this orientation will determine and fix the relative orientations of the chips 18 and the carrier 10 as long as the negative pressure is applied to the ports 30 and/or the restraining grid 38 is in place.

Referring now to FIGS. 7–9, in an alternative embodiment of the carrier 10, facilities 50 are provided for continuously applying and maintaining negative pressure to the ports 30 whether or not a vacuum chuck or similar device is used.

Specifically, the base 12 may include an enclosed chamber or large manifold 52 which communicates with each port 30. Negative pressure is applied to the chamber 52 via a connector 54 which is selectively openable and closable by means of a valve 56. After the wafer 16 is placed on the surface 20, the valve 56 is opened and the connector 54 is associated with an appropriate source of negative pressure. This negatively pressurizes the chamber 52. The lower flat surface of wafer 16 covering the termini 32 of the ports 30 prevents a loss of negative pressure, which, in turn, immobilizes the wafer 16 on the surface 20. The valve 56 is now closed. The continuing negative pressure in the chamber 52 and the seal created by virtue of the wafer flat surface and the flat surface of mesas 28 continues to immobilize the wafer 16, and the carrier 10 may be transported to another location, such as a sawing location. Again, additional gaskets could be used to maintain an air tight seal if desired. During and after sawing of the wafer 16, the negative pressure continues to be applied to the unsawed portions of the wafer 16 as well as to the chips 18 as they are formed.

Accordingly, the continuing negative pressure applied to the chips 18 by the chamber 52 and the ports 30 may serve the same function as the grid 38, that of restraining the chips 18 during transportation of the carrier 10.

As shown in FIG. 9, the chamber or manifold 52 may be replaced with a common inlet duct 58 connected at one end to the connector 54 and to the other end to one passage or manifold 60 of a series of interconnected passages 60 which communicate the negative pressure from the connector 54 to the ports 30. Although the need to use the grid 38 with the embodiment of FIGS. 7–9 is problematic, such use may, of course, be effected if necessary.

As should be apparent, the wafer 16 may be in any stage of processing when it is associated with and immobilized on the carrier 10. Moreover, any number or type of subsequent processing steps on the wafer or on the resulting chips 18 may be left to carry out following sawing. For example, when the wafer 16 is first placed on the carrier 10 it may have undergone processing which has formed active sites therein and thereon—each active site corresponding to a chip 18 to be formed—and which has also delineated the mirrors and beams of DMD's associated with each active site. Following placement of the processed wafer 16 on the carrier 10, sawing results in the chips 18, which continue to be immobilized and/or restrained by the continuous application of negative pressure and/or the grid 38. As a result, the chips 18 may be thereafter cleaned, plasma etched and probed without the presence of the prior art tape which might otherwise interfere with such processing, as noted above.

While various preferred embodiments of the present invention have been described, those skilled in the art will appreciate that various changes of and additions to these embodiments may be made without departing from the present invention as covered by the following claims.

What is claimed is:

1. A method of immobilizing (i) a semiconductor wafer during the sawing thereof to form individual chips and (ii) the resulting chips as and after sawing is completed, which comprises placing the wafer on a carrier so that the wafer and the chips to be formed have a predetermined orientation relative to the carrier;

applying a negative pressure to the wafer through the carrier to immobilize the wafer and to maintain the wafer-carrier orientation and the orientation of the chips to be formed relative to the carrier, negative pressure being applied to the wafer in alignment with the location of each chip to be formed;

sawing the wafer along saw paths into chips while the negative pressure is applied in alignment with and immobilizes each chip as it is formed to maintain the orientation of the chips relative to the carrier; and applying restraining forces to the chips to maintain chip-carrier orientation as the carrier and the chips thereon are transported following sawing.

2. A method as in claim 1, wherein:

the restraining-force-applying step is effected by associating with the chips a grid which extends between adjacent chips, the grid being selectively disassociable from the chips.

3. A method as in claim 1, wherein:

the restraining-force-applying step is effected by continuously applying a negative pressure to the chips following their formation.

4. A method as in claim 3, wherein:

the negative pressure is continuously applied by applying a negative pressure to a chamber within the carrier and then sealing the chamber to retain the negative pressure therewithin during transportation of the carrier and the chips.

5. A method as in claim 1, wherein:

the negative-pressure-applying step is effected by continuously applying a negative pressure to the wafer.

6. A method as in claim 5, wherein:

the negative pressure is continuously applied by applying a negative pressure to a chamber within the carrier and then sealing the chamber to retain the negative pressure therewithin.

7. A method as in claim 1, wherein:

the negative-pressure-applying and restraining force-applying steps are effected by continuously applying a negative pressure first to the wafer and then to the chips.

8. A method as in claim 7, wherein:

the negative pressure is continuously applied by applying a negative pressure to a chamber within the carrier and then sealing the chamber to retain the negative pressure therewithin.

9. A method as in claim 1, wherein:

the predetermined wafer-carrier and chip-carrier orientations are achieved by engaging complementary surface features on the wafer and the carrier when the wafer is placed on the carrier.

10. A method as in claim 9, wherein:

the engaged complementary surfaces on the wafer and the carrier cooperate with the application of the negative pressure to initiate and maintain the predetermined orientation of the wafer relative to the carrier prior to and during sawing, and the application of the restraining force after sawing cooperates with the orientation of the chips as determined by the orientation of the wafer to maintain the orientation of the chips relative to the carrier after sawing.

11. A method as in claim 10, wherein:

the restraining force is mechanically applied to the chips from the saw paths.

12. A method as in claim 10, wherein:

the restraining force is a static fluid force.

13. Apparatus for immobilizing (i) a semiconductor wafer during the sawing thereof to form individual chips and (ii) the resulting chips as and after sawing is completed, which comprises:

a transportable carrier for the wafer, before sawing, and for the chips, after sawing;

means on the carrier for establishing a predetermined orientation of the wafer and of the chips to be formed relative to the carrier;

means for applying a negative pressure to the wafer through the carrier to immobilize the wafer and to maintain the wafer-carrier orientation and the orientation of the chips to be formed relative to the carrier, the negative pressure being applied to the wafer in alignment with the location of each chip to be formed; and means for applying restraining forces to the chips to maintain chip-carrier orientation as the carrier and the chips thereon are transported following sawing.

14. Apparatus as in claim 13, wherein:

the restraining-force-applying means comprises a grid extending between adjacent chips, the grid being selectively disassociable from the chips.

15. Apparatus as in claim 14, which further comprises:

saw guides defined by the carrier,
    the grid being adapted to partially extend into the saw guides.

16. Apparatus as in claim 14, wherein:

the restraining-force-applying means comprises
    means for continuously applying a negative pressure to the chips following their formation.

17. Apparatus as in claim 15, wherein:

the continuous applying means comprises
    passages through the carrier and in alignment with the location of the chips to be formed, and
    means for applying negative pressure to the passages.

18. Apparatus as in claim 16, wherein:

the means for applying negative pressure to the passages comprises
    a chamber defined in the carrier and in communication with the passages, and
    means for applying a negative pressure to the chamber and for thereafter sealing the chamber.

19. A method of immobilizing a semiconductor wafer and resulting individual chips formed therefrom, the wafer having been previously processed to define individual sites thereon, the processed wafer being thereafter immobilized during sawing thereof to form the chips, the chips being restrained or immobilized during further processing of the chips and the transportation of the chips to processing locations, wherein the method comprises:

placing the previously processed wafer on carrier so that the wafer and the sites have a predetermined orientation relative to the carrier;

applying a negative pressure to the wafer through the carrier to maintain the wafer-carrier and site-carrier orientation, negative pressure being applied to the wafer in alignment with each site;

sawing the wafer into chips while the negative pressure is applied in alignment with each site, chip-carrier orientation being determined by site-carrier orientation;

further processing the chips; and applying restraining forces to the chips to maintain chip-carrier orientation as the chips are transported between further processing locations.

20. A method as in claim 19, which further includes:

immobilizing the chips by applying negative pressure to the chips during the further processing.

21. A method as in claim 20, wherein:

a continuously applied negative pressure is responsible for the restraining forces and for the immobilization of the chips during the further processing thereof.

22. A method as in claim 19, wherein:

the restraining-force-applying step is effected by associating with the chips a grid which extends between adjacent chips, the grid being disassociable from the chips during the further processing of the chips.

23. A method as in claim 19, wherein:

the restraining-force-applying step is effected by continuously applying a negative pressure to the wafer in alignment with the sites and, after sawing, to the chips.

24. A method as in claim 23, wherein:

the negative pressure is continuously applied by applying a negative pressure to a chamber within the carrier and then sealing the chamber to retain the vacuum therewithin as the carrier is moved during transportation of the wafer and the chips, the vacuum within the chamber being applied to the wafer in alignment with the sites and, after sawing, with the chips.

25. A method as in claim 19, wherein:

the predetermined wafer-carrier orientation is achieved by engaging complementary surface features on the wafer and the carrier when the wafer is placed on the carrier.

26. Apparatus for immobilizing a semiconducting wafer and individual chips formed therefrom, the wafer having been previously processed to define individual sites thereon, the processed wafer being thereafter immobilized during sawing thereof to separate the sites from each other and thereby form the chips, the chips being restrained and/or immobilized during transportation of the carrier to further processing locations for further processing of the chips, wherein the apparatus comprises:

a portable carrier having saw guides defined thereon;

means on the carrier for establishing a predetermined orientation of the wafer and the sites relative to the saw guides when a wafer is placed on the carrier;

means (a) for applying a negative pressure in alignment with each site through the carrier to a wafer placed thereon to maintain the wafer-carrier and site-carrier orientation during sawing of the wafer into chips using the saw guides, chip-carrier orientation being determined by site-carrier orientation and (b) for applying a negative pressure to each chip during further processing thereof; and means for applying restraining forces to the chips to maintain chip-carrier orientation as the chips are transported.

27. Apparatus as in claim 26, wherein:

the negative pressure-applying means comprises
    a plurality of passages through the carrier and in alignment with the sites and the chips, placement of the carrier on a vacuum chuck applying negative pressure to the passages.

28. Apparatus as in claim 27, wherein:

the restraining-force-applying means comprises
    a chamber defined in the carrier and in communication with the passages, and
    means for applying a vacuum to the chamber and for sealing the evacuated chamber.

29. Apparatus as in claim 27, wherein:

the restraining-force-applying means comprises
    a grid which is selectively associable with the chips to extend between adjacent chips while residing in the saw guides, the grid being disassociable from the chips during further processing of the chips.

* * * * *